(12) United States Patent
Washizu (10) Patent No.: US 7,190,155 B2
(45) Date of Patent: Mar. 13, 2007

(54) TEST APPARATUS AND TESTING METHOD

(75) Inventor: Nobuei Washizu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/208,413

(22) Filed: Aug. 19, 2005

(65) Prior Publication Data
US 2007/0035289 A1 Feb. 15, 2007

(30) Foreign Application Priority Data
Aug. 10, 2005 (JP) .............................. 2005-232171

(51) Int. Cl.
*G01R 25/00* (2006.01)
*G01R 31/26* (2006.01)
*G01R 13/00* (2006.01)
*G01R 31/28* (2006.01)

(52) U.S. Cl. ............... 324/76.77; 324/765; 702/72; 714/744

(58) Field of Classification Search ............ 324/76.77, 324/76.11, 76.52, 750, 759, 763, 765; 702/108, 702/117, 72; 714/738, 744
See application file for complete search history.

(56) References Cited

U.S. PATENT DOCUMENTS

| | | | | |
|---|---|---|---|---|
| 4,451,782 A | * | 5/1984 | Ashida | 324/76.26 |
| 4,600,994 A | * | 7/1986 | Hayashi | 702/72 |
| 4,638,248 A | * | 1/1987 | Schweickert | 324/76.21 |
| 4,975,634 A | * | 12/1990 | Shohet | 324/76.77 |
| 6,324,485 B1 | * | 11/2001 | Ellis | 702/117 |
| 6,573,743 B2 | * | 6/2003 | Sato | 324/765 |
| 6,597,753 B1 | * | 7/2003 | Okayasu et al. | 375/373 |
| 6,700,515 B2 | * | 3/2004 | Asami | 341/120 |
| 6,789,224 B2 | * | 9/2004 | Miura | 714/744 |
| 7,010,729 B2 | * | 3/2006 | Doi et al. | 714/700 |
| 7,034,723 B2 | * | 4/2006 | Suda et al. | 341/122 |
| 7,126,366 B2 | * | 10/2006 | Ohashi et al. | 324/765 |
| 2003/0006786 A1 | * | 1/2003 | Kazama et al. | 324/750 |
| 2005/0246603 A1 | * | 11/2005 | Rottacker et al. | 714/742 |
| 2006/0041772 A1 | * | 2/2006 | Doi | 713/500 |

* cited by examiner

*Primary Examiner*—Andrew H. Hirshfeld
*Assistant Examiner*—Hoai-An D. Nguyen
(74) *Attorney, Agent, or Firm*—Osha•Liang LLP (57) ABSTRACT

There is provided a test apparatus for testing a device-under-test, having a reference clock source for generating reference clock for controlling operations of the device-under-test, a clock regenerating circuit for generating, based on a phase adjusting signal to be inputted, regenerated clock whose frequency is equal with the reference clock and having a phase difference from the reference clock corresponding to the phase adjusting signal, a timing comparator for obtaining a value of an output signal outputted from the device-under-test based on the regenerated clock, a first phase comparing section for outputting the phase adjusting signal that converges the phase difference into a reference phase difference set in advance to the clock regenerating circuit based on the comparison result of the phases of the output signal and the regenerated clock and a storage section for sequentially storing the phase adjusting signals outputted from the first phase comparing section.

7 Claims, 6 Drawing Sheets

TEST APPARATUS AND TESTING METHOD

CROSS REFERENCE TO RELATED APPLICATION

The present application claims priority from a Japanese Patent Application No. 2005-232171 filed on Aug. 10, 2005, the contents of which are incorporated herein by reference.

BACKGROUND OF THE INVENTION

1. Field of the Invention

The present invention relates to a test apparatus and a test method. More specifically, the invention relates to a test apparatus and a test method for testing a memory-under-test.

2. Related Art

Figure 6:
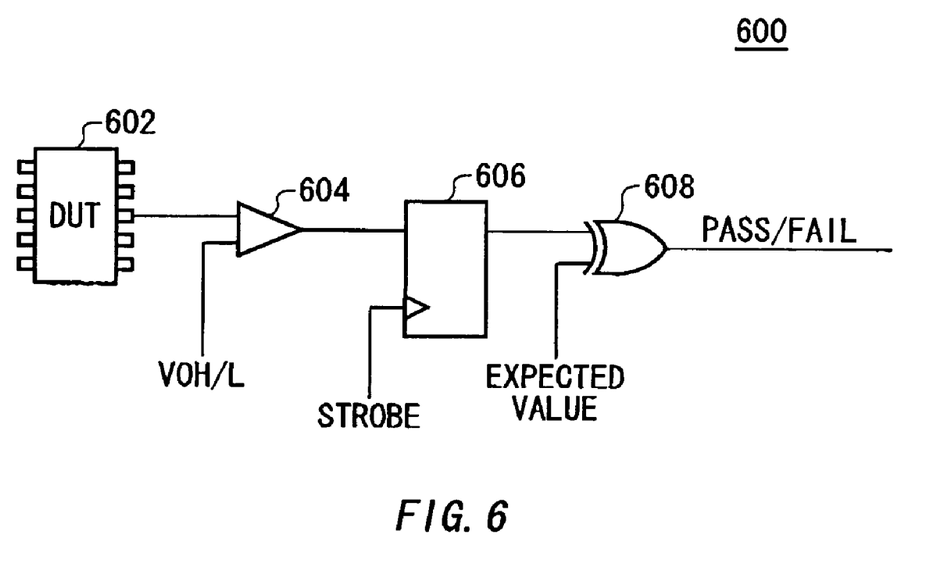
FIG. 6 shows a configuration of a conventional test apparatus.

FIG. 6 shows a configuration of a conventional test apparatus 600. The test apparatus 600 has a level comparator 604, a timing comparator 606 and a logical comparator 608.

The level comparator 604 compares voltage level of an output signal outputted from a device-under-test (hereinafter referred to as DUT) 602 and then the timing comparator 606 obtains it under strobe generated with timing decided in advance within the test apparatus 600.

Next, the logical comparator 608 compares the signal with an expected value to judge whether the DUT 602 is defect-free based on the comparison result.

It is noted that because the present applicant is unaware of existence of any prior art document at the present moment, description concerning to the prior art document will be omitted here.

Lately, there has been developed a high speed serial interface for communicating with a method of transmitting data by embedding clock therein from a transmitter side and of regenerating the clock from the data on a receiver side to receive the data with the regenerated clock.

The data of the high speed serial interface of such clock embedded method allows an uncertain width (jitter) of timing of predetermined scale. However, because timing of strobe for obtaining the output signal of the DUT 602 is decided in advance in the conventional test apparatus 600, it is unable to follow the fluctuation of timing of the output signal of the DUT 602. Therefore, there is a case when the device-under-test having the high speed serial interface as described above cannot be accurately tested.

SUMMARY OF THE INVENTION

Accordingly, it is an object of the invention to provide a test apparatus and a test method capable of solving the above-mentioned problem. This object may be achieved through the combination of features described in independent claims of the invention.

Dependent claims thereof specify preferable embodiments of the invention.

According to a first aspect of the invention, there is provided a test apparatus for testing a device-under-test, having a reference clock source for generating reference clock for controlling operations of the device-under-test, a clock regenerating circuit for generating, based on a phase adjusting signal to be inputted, regenerated clock whose frequency is almost equal with the reference clock and having a phase difference from the reference clock corresponding to the phase adjusting signal, a timing comparator for obtaining a value of an output signal outputted from the device-under-test based on the regenerated clock, a first phase comparing section for outputting the phase adjusting signal that converges the phase difference into a reference phase difference set in advance to the clock regenerating circuit based on the comparison result of the phases of the output signal and the regenerated clock and a storage section for sequentially storing the phase adjusting signals outputted from the first phase comparing section.

The clock regenerating circuit may have a second phase comparing section for outputting a frequency adjusting signal for converging frequency of the regenerated clock to the reference clock based on a comparison result of the phases of the reference clock and the regenerated clock, an adder for outputting a clock adjusting signal obtained by adding the phase adjusting signal and the frequency adjusting signal and a regenerated clock generating section for generating the regenerated clock based on the clock adjusting signal.

The test apparatus may further include a patter generator for generating a test pattern by executing an instruction string for testing the device-under-test and a test signal feeding section for feeding a test signal based on the test pattern to the device-under-test, and the pattern generator may instruct the storage section to start storage of the phase adjusting signals in executing an instruction in an address set in advance.

The test apparatus may further include a patter generator for generating a test pattern by executing an instruction string for testing the device-under-test and a test signal feeding section for feeding a test signal based on the test pattern to the device-under-test, and the pattern generator may instruct the storage section to start storage of the phase adjusting signals in executing an instruction that instructs to start phase adjustment between the output signal and the regenerated clock.

The first phase comparing section may output the phase adjusting signals of digital value per predetermined interval, the clock regenerating circuit may change the phase difference of the regenerated clock from the reference clock corresponding to the phase adjusting signal converted into analog values by a DA converter and the test apparatus may further include an operating section for calculating a theoretical value of the phase difference corresponding to the phase adjusting signals of digital value stored in the storage section based on characteristics of the DA converter that converts a digital input into an analog output and the clock regenerating circuit that changes the phase difference corresponding to the phase adjusting signals of analog value and a display section for displaying a graph of the theoretical value of the phase difference calculated by the operating section.

The first phase comparing section may output the phase difference of an output signal outputted from the device-under-test and the regenerated clock as the phase adjusting signal of digital value and the display section may selectively display either the phase adjusting signal of digital value or the theoretical value of the phase difference based on the characteristics described above under an instruction of a user.

According to a second aspect of the invention, there is provided a test apparatus for testing a device-under-test, having a reference clock source for generating reference clock for controlling operations of the device-under-test, a clock regenerating circuit for generating, based on a phase adjusting signal to be inputted, regenerated clock whose frequency is almost equal with the reference clock and having a phase difference from the reference clock corresponding to the phase adjusting signal, a timing comparator for obtaining a value of an output signal outputted from the device-under-test based on the regenerated clock, a first phase comparing section for outputting the phase adjusting signal that converges the phase difference into a reference phase difference set in advance to the clock regenerating circuit based on the comparison result of the phases of the output signal and the regenerated clock and a judging section for judging at least whether the test is successful and whether the device-under-test is defect-free based on the phase adjusting signal.

The test apparatus may further include a test control section for starting the test of the device-under-test under a condition that a value of the phase adjusting signal falls in a range below an upper limit value set in advance and above a lower limit value set in advance during a detecting period set in advance.

The judging section may detect an abnormality that the test of the device-under-test cannot be started under a condition that the value of the phase adjusting signal did not fall within the range below the upper limit value and above the lower limit value during the detecting period before an elapse of preparation period set in advance from the start of phase adjustment by the phase adjusting signal.

The clock regenerating circuit may include a second phase comparing section for outputting a frequency adjusting signal that converges the frequency of the regenerated clock into the reference clock based on a comparison result of the phases of the reference clock and the regenerated clock, an adder for outputting a clock adjusting signal obtained by adding the phase adjusting signal and the frequency adjusting signal, a regenerated clock generating section for generating the regenerated clock based on the clock adjusting signal and a switching section provided between the second phase comparing section and the adder to output the frequency adjusting signal to the adder in a first operation mode and to output a preset value instead of the frequency adjusting signal to the adder in a second operation mode, and the judging section may detect that the device-under-test is defective under a condition that a fluctuation width of the phase adjusting signal exceeds a reference fluctuation width set in advance in the second operation mode.

According to a third aspect of the invention, there is provided a test method for testing a device-under-test, having a regenerated clock generating step of generating reference clock for controlling operations of the device-under-test, a clock regenerating step of generating, based on a phase adjusting signal to be inputted, regenerated clock whose frequency is almost equal with the reference clock and having a phase difference from the reference clock corresponding to the phase adjusting signal, a timing comparing step of obtaining a value of an output signal outputted from the device-under-test based on the regenerated clock, a first phase comparing step of outputting the phase adjusting signal that converges the phase difference into a reference phase difference set in advance to the clock regenerating circuit based on the comparison result of the phases of the output signal and the regenerated clock and a storing step of sequentially storing the phase adjusting signals outputted from the first phase comparing section.

According to a fourth aspect of the invention, there is provided a test method for testing a device-under-test, having a reference clock generating step of generating reference clock for controlling operations of the device-under-test, a clock regenerating step of generating, based on a phase adjusting signal to be inputted, regenerated clock whose frequency is almost equal with the reference clock and having a phase difference from the reference clock corresponding to the phase adjusting signal, a timing comparing step of obtaining a value of an output signal outputted from the device-under-test based on the regenerated clock, a first phase comparing step of outputting the phase adjusting signal that converges the phase difference into a reference phase difference set in advance to the clock regenerating circuit based on the comparison result of the phases of the output signal and the regenerated clock and a judging step of judging at least whether the test is successful and whether the device-under-test is defect-free based on the phase adjusting signal.

It is noted that the summary of the invention described above does not necessarily describe all necessary features of the invention. The invention may also be a sub-combination of the features described above.

Thus, the invention can provide the test apparatus which is capable of accurately testing the device-under-test that outputs data together with clock.

DETAILED DESCRIPTION OF THE INVENTION

The invention will now be described based on preferred embodiments while showing operations of the invention based on the drawings, which do not intend to limit the scope of the invention, but exemplify the invention. All of the features and the combinations thereof described in the embodiments are not necessarily essential to the invention.

Figure 1:
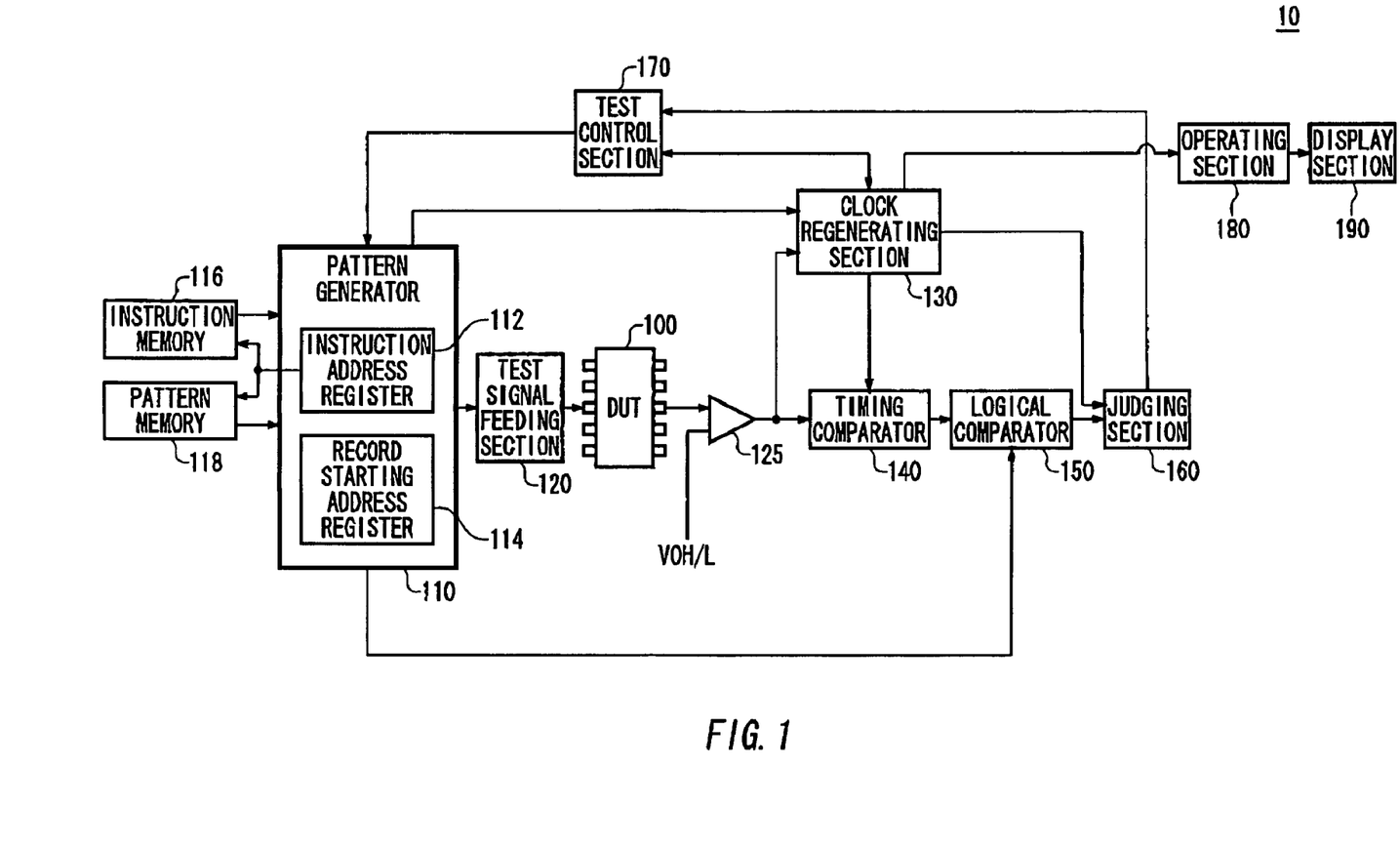
FIG. 1 shows a configuration of a test apparatus according an embodiment of the invention.

FIG. 1 shows a configuration of a test apparatus 10 according to an embodiment of the invention. The test apparatus 10 of the embodiment obtains data with timing corresponding to clock outputted from a DUT 100 while operating based on reference clock. Thereby, the test apparatus 10 is capable of adequately testing the data outputted from the DUT 100 in the test of the DUT 100.

The test apparatus 10 has a pattern generator 110, an instruction memory 116, a pattern memory 118, a test signal feeding section 120, a level comparator 125, a clock regenerating section 130, a timing comparator 140, a logical comparator 150, a judging section 160, a test control section 170, an operating section 180 and a display section 190.

The pattern generator 110 generates a test pattern for testing the DUT 100. The pattern generator 110 of the embodiment controls sequence of the test by executing an instruction string for testing the DUT 100 stored in the instruction memory 116 and outputs the test pattern stored in the pattern memory 118 in correlation with the respective instructions to the test signal feeding section 120. Instead of that, the pattern generator 110 may be an algorithmic pattern generator that sequentially generates test patterns based on an algorithm specified in advance, not by the instruction sequence.

The pattern generator 110 has an instruction address register 112 and a recording start address register 114. The instruction address register 112 stores an address of instruction to be executed next. The pattern generator 110 reads the instruction and the test pattern stored in an address specified by the instruction address register 112 from the instruction memory 116 and the pattern memory 118 to obtain the instruction to be executed next and the test pattern to be outputted to the test signal feeding section 120 in executing the instruction.

A user of the test apparatus 10 presets the recording start address register 114. Then, in executing the instruction in the address set in advance in the recording start address register 114, the pattern generator 110 instructs a storage section 280 within the clock regenerating section 130 to start storage of a phase adjusting signal for adjusting a phase of regenerated clock generated by the clock regenerating section 130 based on the output signal of the DUT 100. Still more, the pattern generator 110 may instruct the storage section 280 to start storage of the phase adjusting signal in executing an instruction instructing to start to adjust phases between the output signal and the regenerated clock. It is noted that the detail of the phase adjusting signal and the storage section 280 will be described later.

The test signal feeding section 120 feeds a test signal formed based on the test pattern to the DUT 100. More specifically, receiving the test pattern from the pattern generator 110, the test signal feeding section 120 forms the signal having a waveform specified by the test pattern to generate the test signal corresponding to the timing specified by the test pattern. Then, the test signal feeding section 120 feeds the test signal to the DUT 100 via a driver.

The level comparator 125 receives the output signal outputted from the DUT 100 and detects whether voltage level of the output signal corresponds to voltage level of logical value H or L. The clock regenerating section 130 regenerates the clock outputted from the DUT 100 in synchronism with the data as regenerated clock based on the output signal outputted from the DUT 100. Exemplified in the present embodiment is the output signal of the DUT 100 of the clock embedded method in which the clock is superimposed in the output data.

Instead of that, the type of the DUT 100 may be that of a source synchronous method by which a first output signal transmitting output data and a second output signal transmitting clock for the output data are outputted from different terminals. In this case, the clock regenerating section 130 generates the regenerated clock based on the second output signal outputted from the DUT 100.

The timing comparator 140 obtains a value of the output signal based on the regenerated clock. In case of the clock embedded method, the timing comparator 140 obtains the value of data contained in the output signal by taking in the output signal containing the clock and data with the timing of the regenerated clock. In case of the source synchronous method on the other hand, the timing comparator 140 obtains the value of data contained in the first output signal by taking in the first output signal transmitting the data with the timing of the regenerated clock generated based on the second output signal.

The logical comparator 150 compares the value of the output signal taken into the timing comparator 140 with an expected value set in advance from the test pattern. The judging section 160 judges whether the DUT 100 is defect-free based on the comparison result of the logical comparator 150. Here, the judging section 160 may judge at least either one whether the test is successful and whether the DUT 100 is defect-free based on the phase adjusting signal of the clock regenerating section 130.

The test control section 170 controls the test of the test apparatus 10. The operating section 180 processes the phase adjusting signal of the clock regenerating section 130 to display. The display section 190 displays the phase adjusting signal of the clock regenerating section 130 to the user of the test apparatus 10.

Figure 2:
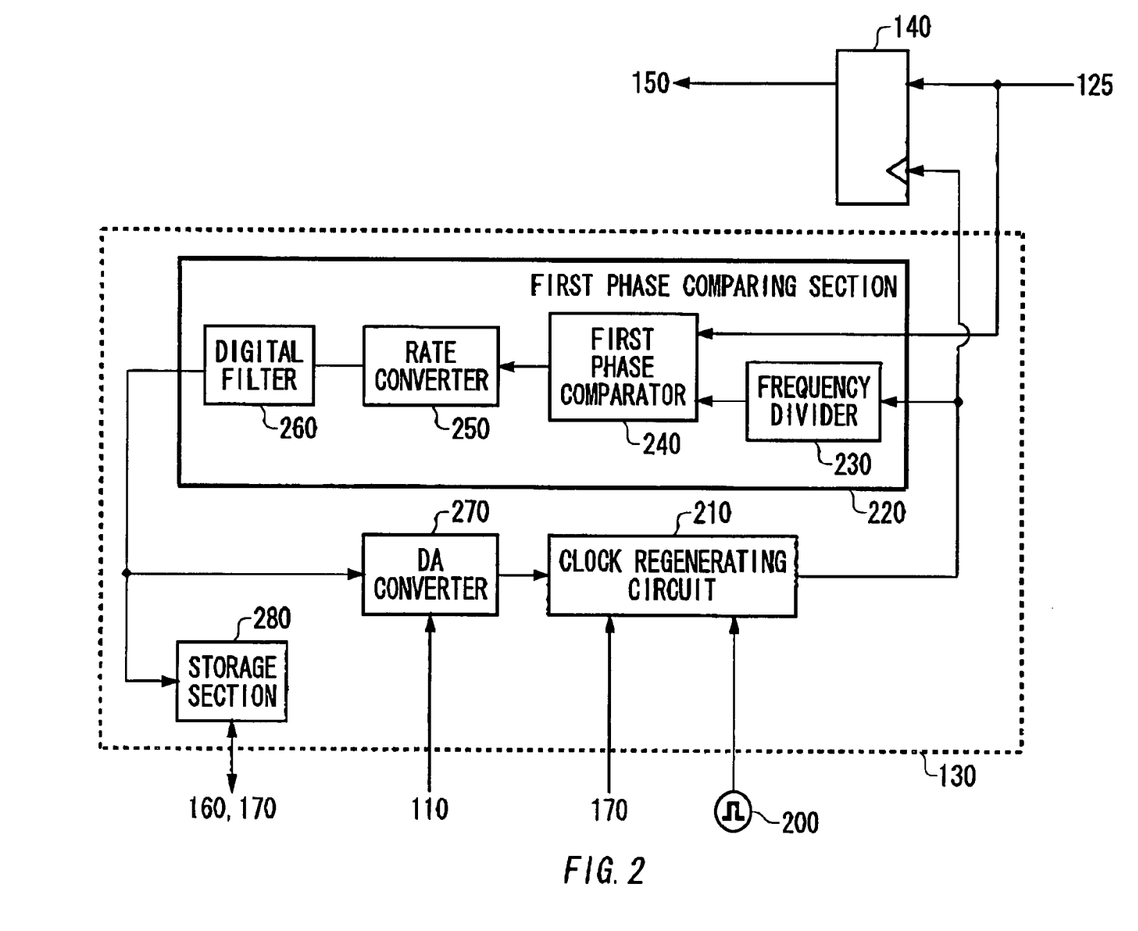
FIG. 2 shows a configuration of a clock regenerating section of the invention together with a timing comparator.

FIG. 2 shows a configuration of the clock regenerating section 130 of the embodiment together with the timing comparator 140. A reference clock source 200 generates reference clock which is the base of the operation of the test apparatus 10. The test apparatus 10 feeds this reference clock to the DUT 100 as clock for controlling the operation of the DUT 100. The test apparatus 10 and the DUT 100 may be operated in synchronism by thus using the same reference clock.

The clock regenerating section 130 receives the output signal of the DUT 100 via the level comparator 125 as well as the reference clock of the reference clock source 200. Then, based on the output signal and the reference clock, the clock regenerating section 130 generates the regenerated clock.

The clock regenerating section 130 has a clock regenerating circuit 210, a first phase comparing section 220, a DA converter 270 and the storage section 280. The clock regenerating circuit 210 generates the regenerated clock whose frequency is almost equal with that of the reference clock and having a phase difference from the reference clock corresponding to the phase adjusting signal based on the phase adjusting signal inputted from the DA converter 270. The first phase comparing section 220 is connected so as to receive the regenerated clock outputted from the clock regenerating circuit 210 and to receive the output signal of the DUT 100 via the level comparator 125. Based on the comparison result of the phases of the output signal outputted from the DUT 100 and of the regenerated clock, the first phase comparing section 220 outputs the phase adjusting signal that converges the phase difference between the reference clock and the regenerated clock into a reference phase difference set in advance to the clock regenerating circuit 210.

The first phase comparing section 220 includes a frequency divider 230, a first phase comparator 240, a rate converter 250 and a digital filter 260. The frequency divider 230 divides the regenerated clock so that it has the almost same frequency with the clock superimposed on the output signal. The first phase comparator 240 compares phases of leading or trailing edge of the divided regenerated clock with that of leading or trailing edge of the output signal of the DUT 100 and outputs a comparison result to the rate converter 250. The rate converter 250 converts the comparison result outputted from the first phase comparator 240 every time when it compares the phases of the edges of the regenerated clock and the output signal to a comparison result of lower rate. That is, the rate converter 250 totals the comparison results inputted from the first phase comparator 240 per predetermined period of time for example to convert to the comparison result per predetermined period of time.

The digital filter 260 has a function of a sort of low pas filter by FIR for example. It receives the comparison result outputted from the rate converter 250 and outputs the phase adjusting signal used for phase adjustment of the clock regenerating circuit 210. It is noted that the first phase comparing section 220 of the embodiment uses digital signals for the comparison result outputted from the first phase comparator 240, the comparison result outputted from the rate converter 250 and the phase adjusting signal outputted from the digital filter 260. Accordingly, the first phase comparing section 220 outputs the phase adjusting signal of digital value per preset interval. Instead of that, the first phase comparator 240, the rate converter 250 and the digital filter 260 may use analog signals for their signals.

The DA converter 270 is connected to the first phase comparing section 220 and converts the phase adjusting signal of digital value outputted from the first phase comparing section 220 into a phase adjusting signal of analog value. Thereby, the clock regenerating circuit 210 can advance the phase of the regenerated clock when the regenerated clock is late from the timing for taking in the output signal of the DUT 100 and can delays the phase of the regenerated clock when the regenerated clock is fast, thus converging the phase difference of the output signals to the reference phase difference set in advance. It is noted that the DA converter 270 outputs a phase adjusting signal having a constant value set in advance corresponding to an instruction from the pattern generator 110 when no phase adjustment is made between the output signal of the DUT 100 and the regenerated clock. Then, receiving the instruction to start the phase adjustment from the pattern generator 110, the DA converter 270 outputs the phase adjusting signal of analog value corresponding to the input from the digital filter 260.

The storage section 280 is connected with the first phase comparing section 220 and sequentially stores the phase adjusting signals outputted from the first phase comparing section 220 when it receives an instruction from the pattern generator 110 to start storage of the phase adjusting signals. For example, the storage section 280 receives the phase adjusting signals of digital value from the first phase comparing section 220 per sampling interval of the digital filter 260 and sequentially stores the phase adjusting signals per sampling interval. In the modified example in which the output of the first phase comparing section 220 is the analog phase adjusting signal, the storage section 280 may store the phase adjusting signals after converting into digital signals by an AD converter.

Figure 3:
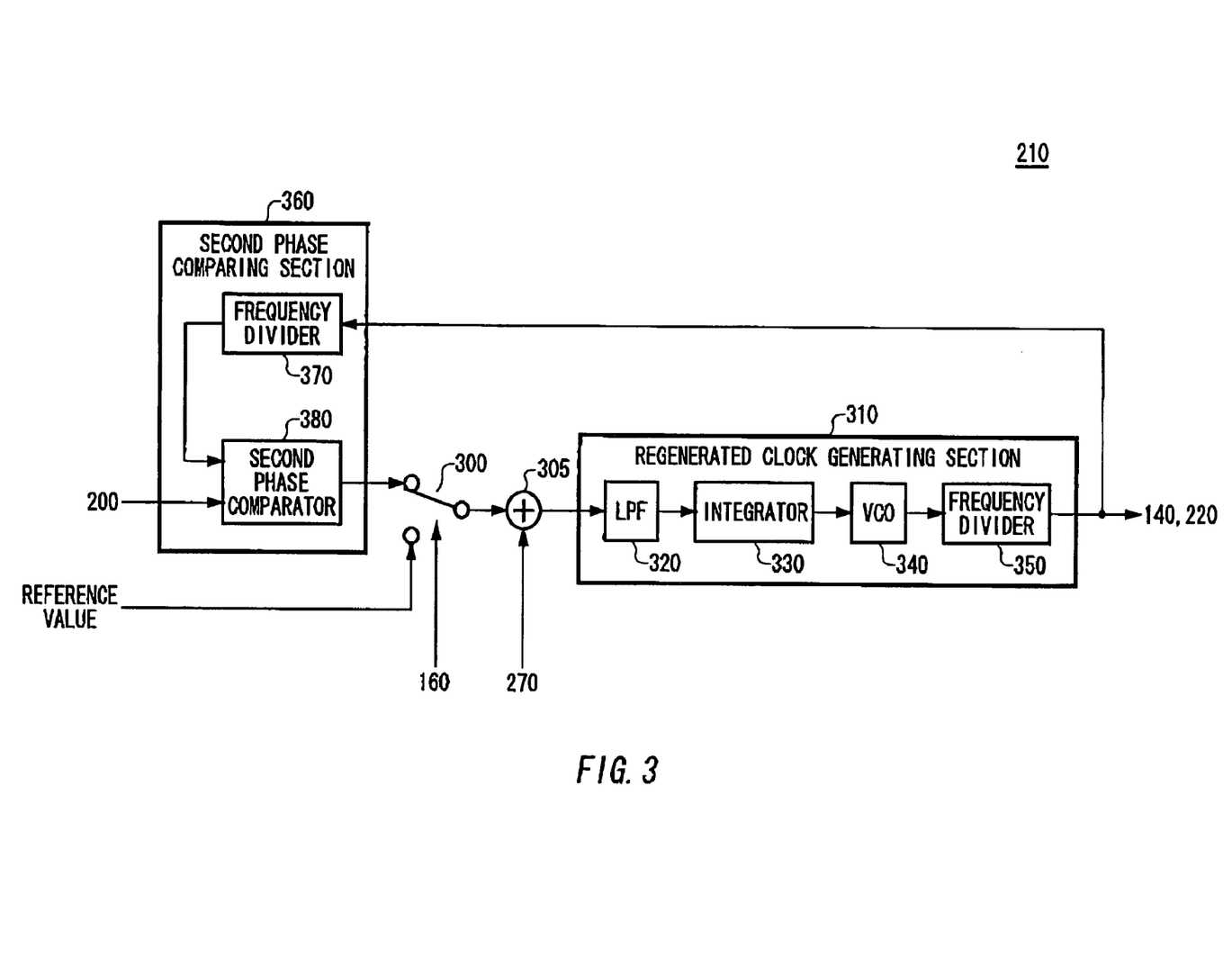
FIG. 3 shows a configuration of a clock regenerating circuit of the invention.

FIG. 3 shows a configuration of the clock regenerating circuit 210 of the present embodiment. The clock regenerating circuit 210 phase-locks the regenerated clock so as to have a phase difference from the reference clock based on the phase adjusting signal from the DA converter 270. The clock regenerating circuit 210 of the present embodiment includes a second phase comparing section 360, a switching section 300, an adder 305 and a regenerated clock generating section 310.

The second phase comparing section 360 is connected so as to receive the regenerated clock outputted from the regenerated clock generating section 310. The second phase comparing section 360 includes a frequency divider 370 and a second phase comparator 380. The frequency divider 370 divides the regenerated clock to convert into frequency so as to be able to compare its phase with the reference clock. The second phase comparator 380 compares the phases of the reference clock and of the divided regenerated clock and outputs a frequency adjusting signal that converges the frequency of the regenerated clock into the reference clock based on the comparison result. This frequency adjusting signal may be a signal that phase-locks so that the phase difference of the regenerated clock outputted from the regenerated clock generating section 310 and the reference clock is converged into a value determined by the phase adjusting signal from the DA converter 270. The switching section 300 is provided between the second phase comparing section 360 and the adder 305 to output the frequency adjusting signal to the adder 305 in a first operation mode and to output a reference value set in advance, instead of the frequency adjusting signal, to the adder 305 in a second operation mode.

The adder 305 is connected so as to receive the phase adjusting signal outputted from the DA converter 270 and the signal outputted from the switching section 300. In the first mode, the adder 305 outputs a clock adjusting signal obtained by adding the phase adjusting signal inputted from the DA converter 270 and the frequency adjusting signal inputted from the second phase comparing section 360 via the switching section 300. In the second mode, the adder 305 outputs a clock adjusting signal obtained by adding the phase adjusting signal inputted from the DA converter 270 with the reference value inputted from the switching section 300.

The regenerated clock generating section 310 is connected with the adder 305 so as to receive the clock adjusting signal outputted from the adder 305 and generates the regenerated clock based on the clock adjusting signal inputted from the adder 305. The regenerated clock generating section 310 includes an LPF (low pass filter) 320, an integrator 330, a VCO (voltage controlled oscillator) 340 and a frequency divider 350. The 320 passes a frequency component lower than frequency set in advance in the clock adjusting signal inputted from the adder 305. The integrator 330 is connected so as to receive the clock adjusting signal outputted from the LPF 320 and integrates the clock adjusting signal to feed to the VCO 340. The VCO 340 is connected so as to receive the integrated clock adjusting signal outputted from the integrator 330 and generates clock having frequency corresponding to the integrated value of the clock adjusting signal. The frequency divider 350 is connected so as to receive the clock of the VCO 340 and divides the clock to generate regenerated clock.

The clock regenerating section 130 described above is capable of generating the regenerated clock based on the reference clock of the test apparatus 10 and the output signal of the DUT 100 and allows to obtain the data outputted from the DUT 100 with the timing based on the regenerated clock. Because the DUT 100 operates based on the reference clock of the test apparatus 10, the clock regenerating section 130 can phase-lock so that the phase difference of the clock embedded in the output signal and the regenerated clock is converged into a predetermined value while synchronizing the frequency so that the frequencies of the reference clock and the regenerated clock are synchronized. Then, because the test apparatus 10 can store the phase adjusting signal corresponding to the phase difference of the output signal and the regenerated clock in the storage section 280, it can use the stored phase adjusting signal in the later analysis.

Figure 4:
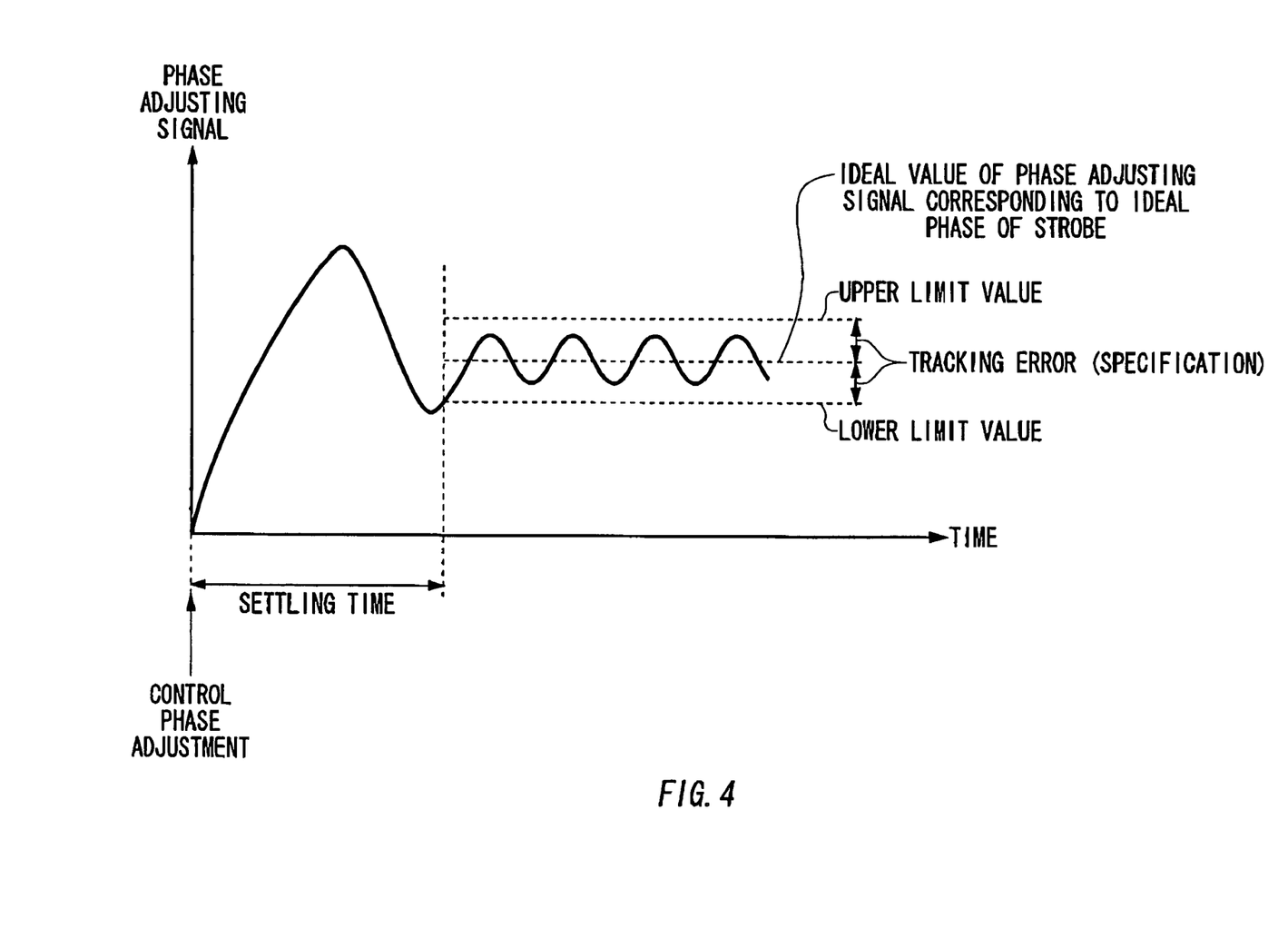
FIG. 4 shows changes of a phase adjusting signal stored in a storage section of the invention.

FIG. 4 shows changes of the phase adjusting signals stored in the storage section 280 of the embodiment. The axis of abscissa of the graph represents an elapse of time and the axis of ordinate represents values of the phase adjusting signal. At first, the clock regenerating section 130 outputs a phase adjusting signal of constant value from the DA converter 270 in a state in which phase adjustment is not being made. In this case, a loop route of the first phase comparing section 220, the DA converter 270 and the clock regenerating circuit 210 is cut off, so that no phase adjustment is made with the output signal of the DUT 100.

Next, the pattern generator 110 instructs the clock regenerating section 130 to start phase adjustment when an instruction address in the instruction address register 112 coincides with an address stored in the pattern generator 110 or when an instruction for instructing to start phase adjustment is executed. Instead of that, the clock regenerating section 130 may start the phase adjustment under another condition in case when it is instructed to start execution of a test program for example. Still more, along with the start of the phase adjustment, the pattern generator 110 instructs the storage section 280 to start storage of the phase adjusting signals. Thereby, the storage section 280 starts to store the phase adjusting signals sequentially.

Receiving the instruction to start the phase adjustment, the DA converter 270 within the clock regenerating section 130 converts the phase adjusting signals of digital value inputted from the first phase comparing section 220 into the phase adjusting signals of analog value and outputs them. Thereby, the loop route of the first phase comparing section 220, the DA converter 270 and the clock regenerating circuit 210 becomes conductive and the phase adjustment is made with the output signal of the DUT 100.

After a settling period from the start of the phase adjustment shown in the graph, the phase of the clock embedded in the output signal of the DUT 100 is synchronized with that of the regenerated clock. At this time, the phase difference of those clocks is stabilized to a value within a range of tracking error preset from the specification centering on ideal phase of a strobe signal. Along that, the phase adjusting signal outputted from the first phase comparing section 220 is stabilized to a value within a range below an upper limit value set in advance and above a lower limit value set in advance including an ideal value of the phase adjusting signal corresponding to the ideal phase of the strobe signal. Then, the test control section 170 monitors the phase adjusting signals stored in the storage section 280 and starts the test of the DUT 100 under a condition that the phase adjusting signals have had the value within the range described above during a preset detecting period. Then, receiving the instruction to start the test, the pattern generator 110 and the test signal feeding section 120 feed a test signal to the DUT 100. Thereby, the test control section 170 can detect the completion of the phase adjustment and start the test.

Still more, the judging section 160 monitors the phase adjusting signals stored in the storage section 280 and detects an abnormality that the test of the DUT 100 cannot be started when the phase adjusting signals cannot maintain the value below the upper limit value and above the lower limit value during the preset detecting period before an elapse of preparation period set in advance from the start of the phase adjustment by the phase adjusting signals. Thereby, the judging section 160 can judge that the test is in failure when the phase adjustment is not completed before the elapse of the predetermined preparation period.

The test apparatus 10 may also judge the stability of the clock embedded in the output signal of the DUT 100. That is, the test control section 170 changes the operation mode of the clock regenerating section 130 to the second operation mode to input the preset reference value from the judging section 160 to the adder 305. Thereby, the test control section 170 can cut off the loop route within the clock regenerating circuit 210 and put the loop route of the regenerated clock generating section 310, the first phase comparing section 220 and the DA converter 270 into a conductive state. In this state, the clock regenerating section 130 carries out the phase adjustment between the clock contained in the output signal of the DUT 100 and the regenerated clock.

The test control section 170 uses this regenerated clock to detect fluctuation of the phase of the clock outputted from the DUT 100 to judge the stability of the clock. More specifically, in a state when the phase adjustment ends, the judging section 160 detects that the phase of the clock outputted from the DUT 100 is unstable and that the DUT 100 is defective under the condition that a width of fluctuation of the phase adjusting signal stored in the storage section 280 in the second operation mode exceeds a reference fluctuation width set in advance.

Thus, according to the test apparatus 10 described above, it is possible to judge whether the test is successful and whether the DUT 100 is defect-free based on the phase adjusting signal outputted from the first phase comparing section 220.

Figure 5:
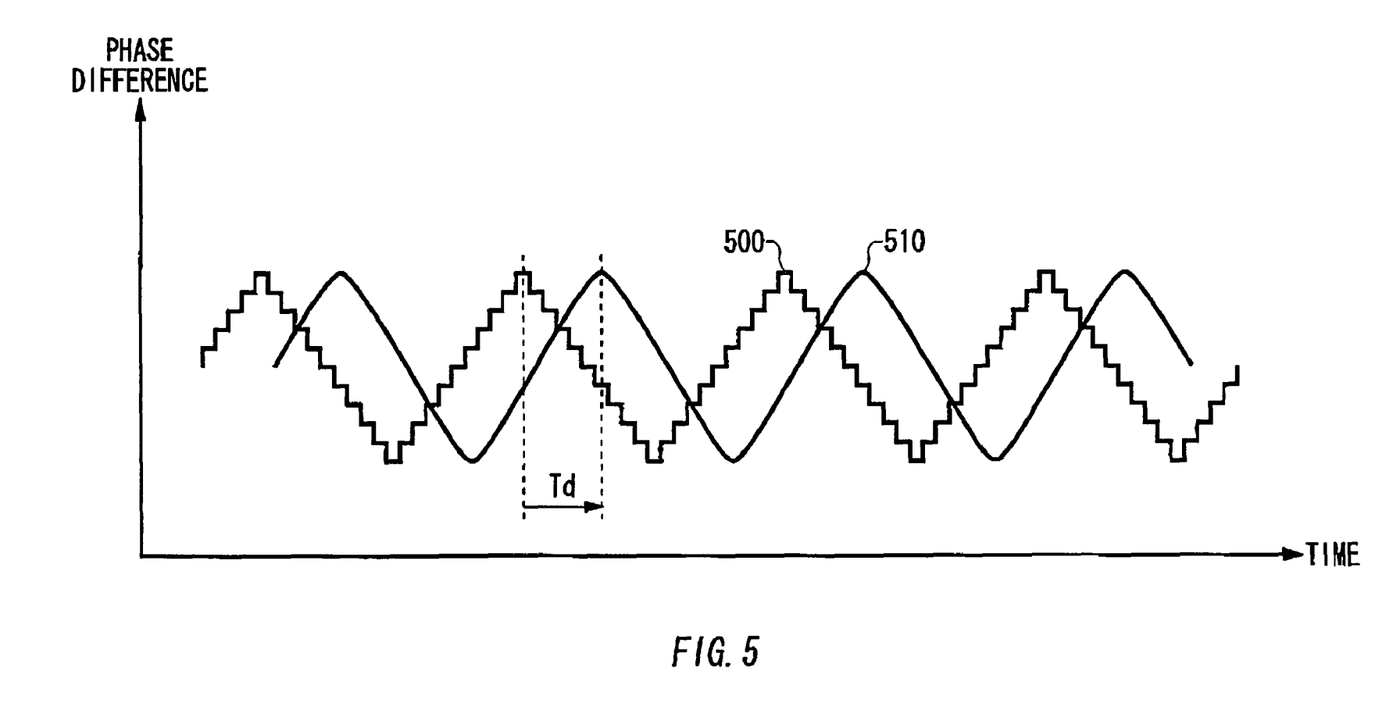
FIG. 5 shows one exemplary graph displayed in a display section of the invention.

FIG. 5 is one exemplary graph displayed by the display section 190 of the embodiment. The axis of abscissa represents an elapse of time and the axis of ordinate represents the phase difference of the regenerated clock to the reference clock. The storage section 280 sequentially stores the phase adjusting signals of digital value outputted from the first phase comparing section 220. Next, the operating section 180 calculates the phase difference of the regenerated clock to the reference clock corresponding to the phase adjusting signal stored in the storage section 280. Then, the display section 190 displays this phase difference so that the user of the test apparatus 10 can observe the fluctuation of the phase difference.

In the present embodiment, the first phase comparing section 220 outputs the phase difference of the output signal outputted from the DUT 100 and the regenerated clock as the phase adjusting signal of digital value. In this case, the display section 190 can display the phase difference of the output signal outputted from the DUT 100 and the regenerated clock as a value discretely changing as indicated by a series 500 by displaying the changes of the phase adjusting signal. However, in an actual circuit, a delay Td occurs in the fluctuation of the phase difference because the clock regenerating circuit 210 changes the phase difference of the regenerated clock from the reference clock corresponding to the phase adjusting signal converted into an analog value by the DA converter 270. Still more, changes such as smoothing of the fluctuation of phase difference occur corresponding to the characteristics of the DA converter 270 and the clock regenerating circuit 210.

Then, in order to display a value almost equal with the actual phase difference to the user of the test apparatus 10, the operating section 180 calculates a theoretical value of the phase difference corresponding to the phase adjusting signal of digital value stored in the storage section 280 based on the characteristics of the DA converter 270 that converts a digital input to an analog output and of the clock regenerating circuit 210 that changes the phase difference corresponding to the phase adjusting signal of analog value, i.e., a designed value for example. The operating section 180 can calculate the theoretical value of the phase difference by storing in advance a transfer function in which transfer funcitons of the DA converter 270, the LPF 320, the integrator 330, the VCO 340 and the frequency divider 350 are combined and by converting the phase adjusting signal of digital value by using the transfer function. Then, the display section 190 displays a graph of the theoretical value of the phase difference calculated by the operating section 180. Thereby, the display section 190 can display the value closer to the actual phase difference to the user of the test apparatus 10.

It is noted that the display section 190 may be arranged so as to selectively display the phase adjusting signal of digital value as the phase difference or to display the theoretical value of the phase difference based on the characteristics described above in accordance to an instruction of the user of the test apparatus 10.

Accordingly, the operating section 180 and the display section 190 described above can display the fluctuation of the phase difference of the reference clock and the regenerated clock based on the phase adjusting signals stored in the storage section 280. Thereby, when the test ends in failure, the user of the test apparatus 10 can discriminate factors of the failure of the test by judging whether the clock outputted from the DUT 100 is defect-free and can debug the test program more easily.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

What is claimed is:

1. A test apparatus for testing a device-under-test, comprising:
   a reference clock source for generating reference clock for controlling operations of said device-under-test;
   a clock regenerating circuit for generating, based on a phase adjusting signal to be inputted, regenerated clock whose frequency is equal to the frequency of said reference clock and having a phase difference from said reference clock corresponding to said phase adjusting signal;
   a timing comparator for obtaining a value of an output signal outputted from said device-under-test based on said regenerated clock;
   a first phase comparing section for outputting said phase adjusting signal that converges said phase difference into a reference phase difference set in advance to said clock regenerating circuit based on the comparison result of the phases of said output signal and said regenerated clock; and
   a storage section for sequentially storing said phase adjusting signals outputted from said first phase comparing section.

2. The test apparatus as set forth in claim 1, wherein said clock regenerating circuit has a second phase comparing section for outputting a frequency adjusting signal for converging frequency of said regenerated clock to said reference clock based on the comparison result of the phases of said reference clock and said regenerated clock;
   an adder for outputting a clock adjusting signal obtained by adding said phase adjusting signal and said frequency adjusting signal; and
   a regenerated clock generating section for generating said regenerated clock based on said clock adjusting signal.

3. The test apparatus as set forth in claim 1, further comprising:
   a pattern generator for generating a test pattern by executing an instruction string for testing said device-under-test; and
   a test signal feeding section for feeding a test signal based on said test pattern to said device-under-test; wherein
   said pattern generator instructs said storage section to start storage of said phase adjusting signals in executing an instruction in an address set in advance.

4. The test apparatus as set forth in claim 1, further comprising:
   a pattern generator for generating a test pattern by executing an instruction string for testing said device-under-test; and
   a test signal feeding section for feeding a test signal based on said test pattern to said device-under-test; wherein
   said pattern generator instructs said storage section to start storage of said phase adjusting signals in executing an instruction that instructs to start phase adjustment between said output signal and said regenerated clock.

5. The test apparatus as set forth in claim 1, wherein said first phase comparing section outputs said phase adjusting signals of digital value per predetermined interval;
   said clock regenerating circuit changes the phase difference of said regenerated clock to said reference clock corresponding to said phase adjusting signal converted into analog values by a DA converter; and
   said test apparatus further comprising:
   an operating section for calculating a theoretical value of said phase difference corresponding to said phase adjusting signals of digital value stored in said storage section based on characteristics of said DA converter that converts a digital input into an analog output and of said clock regenerating circuit that changes said phase difference corresponding to said phase adjusting signals of analog value; and
   a display section for displaying a graph of the theoretical value of said phase difference calculated by said operating section.

6. The test apparatus as set forth in claim 5, wherein said first phase comparing section outputs the phase difference of an output signal outputted from said device-under-test and said regenerated clock as the phase adjusting signal of digital value; and
   said display section selectively displays either the phase adjusting signal of digital value or the theoretical value of the phase difference based on the characteristics under an instruction of a user.

7. A test method for testing a device-under-test, comprising:
   a regenerated clock generating step of generating reference clock for controlling operations of said device-under-test;
   a clock regenerating step of generating, using a clock regenerating circuit based on a phase adjusting signal to be inputted, regenerated clock whose frequency is equal to the frequency of said reference clock and having a phase difference from said reference clock corresponding to said phase adjusting signal;
   a timing comparing step of obtaining a value of an output signal outputted from said device-under-test based on said regenerated clock;
   a first phase comparing step of outputting said phase adjusting signal that converges said phase difference into a reference phase difference set in advance to said clock regenerating circuit based on the comparison result of the phases of said output signal and said regenerated clock;
   a storing step of sequentially storing said phase adjusting signals outputted from said first phase comparing step; and an outputting step of outputting said phase adjusting signals outputted from said first phase comparing step.

* * * * *